United States Patent [19]

Mirza

[11] Patent Number: 5,793,650
[45] Date of Patent: Aug. 11, 1998

[54] SYSTEM AND METHOD OF IDENTIFYING THE NUMBER OF CHIP FAILURES ON A WAFER ATTRIBUTED TO CLUSTER FAILURES

[75] Inventor: Agha I. Mirza, Forest Hills, N.Y.

[73] Assignee: Analog Devices, Inc., Wilmington, Mass.

[21] Appl. No.: 545,261

[22] Filed: Oct. 19, 1995

[51] Int. Cl.$^6$ .................................................. G01R 31/26
[52] U.S. Cl. ............... 364/552; 364/468.16; 364/468.28; 437/8; 324/765
[58] Field of Search ...................... 364/552, 554, 364/468.28, 468.16, 488, 578; 437/8, 923; 148/DIG. 162; 29/593; 324/765, 754; 257/48

[56] References Cited

U.S. PATENT DOCUMENTS

| | | | |
|---|---|---|---|
| T959,005 | 6/1977 | Froot et al. | 364/552 |
| 3,615,466 | 10/1971 | Sahni | 437/8 |
| 3,751,647 | 8/1973 | Maeder et al. | 364/552 |
| 4,144,493 | 3/1979 | Lee et al. | 324/765 |
| 5,047,947 | 9/1991 | Stump | 364/554 |
| 5,351,202 | 9/1994 | Kurtzberg et al. | 364/552 |
| 5,394,348 | 2/1995 | Abe | 364/552 |
| 5,396,433 | 3/1995 | Kosugi et al. | 364/554 |
| 5,539,652 | 7/1996 | Tegethoff | 364/488 |
| 5,598,341 | 1/1997 | Ling et al. | 364/468.28 |

OTHER PUBLICATIONS

Stapper et al., "integrated Circuit Yield Statistics". Proceedings of the IEEE, vol. 71, No. 4, Apr. 1983, pp. 453–469.
Tyagi et al., "Defect Clustering Viewed Through Generalized Poisson Distribution", IEEE Transactions on Semiconductor Manufacturing, vol. 5, No. 3, Aug. 1992, pp. 196–206.

Randall S. Collica, "The Effect of the Number of Defect Mechanisms on Fault Clustering and its Detection Using Yield Model Parameters", IEEE Transactions on Semiconductor Manufacturing, vol. 5, No. 3, Aug. 1992, 189–195.

James A. Cunningham, "The Use and Evaluation of Yield Models in Integrated Circuit Manufacturing", IEEE Transactions on Semiconductor Manufacturing, vol. 3, No. 2, May 1990, pp. 60–71.

De Gyvez et al., "On the Design and Implementation of a Wafer Yield Editor", IEEE Transactions on Computer-Aided Design, vol. 8, No. 8, Aug. 1989, pp. 920–925.

John Shier, "A Statistical Model for Integrated-Circuit Yield with Clustered Flaws", IEEE Transactions on Electron Devices, vol. 35, No. 4, Apr. 1988, pp. 524–525.

*Primary Examiner*—Emanuel T. Voeltz
*Assistant Examiner*—Eric W. Stamber
*Attorney, Agent, or Firm*—Iandiorio & Teska

[57] ABSTRACT

A method of identifying the non-clustered failure yield on a wafer which includes: measuring an absolute yield of the chips on a wafer; identifying a first set of clustered failed chips in which each failed chip is disposed in a field of chips whose yield is below the absolute yield; determining an adjusted yield discounted for the first set of clustered failed chips; identifying at least one additional set of clustered failed chips in which each failed chip is disposed in a field of chips whose yield is below the adjusted yield; and determining an additional adjusted yield for each additional set of clustered failed chips discounting for the previous set of clustered failed chips until the difference between the additional adjusted yield and the previous adjusted yield are within a predetermined maximum acceptable difference for indicating a non-clustered failure yield of the wafer.

30 Claims, 5 Drawing Sheets

5,793,650

1

SYSTEM AND METHOD OF IDENTIFYING THE NUMBER OF CHIP FAILURES ON A WAFER ATTRIBUTED TO CLUSTER FAILURES

FIELD OF INVENTION

This invention relates to a system and method of identifying the number of chip failures on a wafer attributed to cluster failures, and more particularly to such a method that is capable of separately identifying the yield loss due to local deformation mechanisms (random failures) and gross deformation mechanisms (cluster failures).

BACKGROUND OF INVENTION

Rapid technological advancements in the semi-conductor industry have lead to an increase in integration and decrease in dimensions of electronic devices in integrated circuit (IC) chips. This has resulted in an overwhelming increase in the complexity of semiconductor manufacturing and sensitivity of IC performance to process fluctuations enhancing the ever present challenge of obtaining high yields of functional IC chips on wafers. Wafer yield is defined as the ratio of the number of chips that are tested functional on fabricated wafers to the total number of chips on these wafers.

The semiconductor IC manufacturing process involves modifying physical composition and geometry of semiconductor material in complex patterns and in extremely small dimensions to achieve desired electrical functions from the IC. Disturbances and fluctuations in the manufacturing environment cause deformations in the IC structure which in turn cause the chip to become non-functional. The deformation mechanisms encountered by ICs can be broadly classified into two categories, namely, local and gross. Gross deformation mechanisms affect all chips in a region of the wafer or the entire wafer in a similar fashion, whereas the local deformation mechanisms affect small areas of isolated chips independently of other chips on the wafer. Examples of local deformations include pin holes, pipes, and photolithography spot defects. Manufacturing errors such as mask misalignments, variations in process temperatures and heating durations, and non-uniform impurity concentration across the wafer form some examples of gross deformation mechanisms.

The regions containing gross deformation mechanisms contain all bad chips in clusters and are called zero yield regions. The regions containing local deformation mechanisms consist of both good and bad chips distributed randomly on the wafers and are called non-zero yield regions. Local deformation mechanisms are expected and accepted naturally occurring defects, whereas gross deformation mechanism are due to preventable manufacturing errors. The presence of one or more zero yield regions on a wafer indicates that a discrepancy is likely to occur between the measured wafer yield and yield predicted by yield models because yield models do not accurately account for zero yield regions and typically assume only the presence of non-zero yield regions.

Because gross deformation mechanisms are generally not taken into account in yield modeling and yield measurement techniques, the actual chip yields that are achieved and accepted are often much lower than they should be. That is, if one knew, for example, that the measured yield was 60%, but 10% of the yield loss was due to gross deformation mechanisms (i.e. 70% yield due to local deformation mechanisms) corrective measures could be taken to prevent such gross deformation mechanisms from occurring in subsequent wafer processing runs. This would increase the overall chip yield and thereby reduce the costs to the purchaser.

Since present yield measurement and prediction techniques do not separately account for local and global deformation mechanisms, purchasers of IC chips are very often required to purchase more defective chips than necessary, thereby increasing their overall cost.

SUMMARY OF INVENTION

It is therefore an object of this invention to provide a system and method of identifying the number of chip failures on a wafer attributed to cluster failures which distinguishes the portions of the yield loss due to gross and local deformation mechanisms.

It is a further object of this invention to provide such a system and method of identifying the number of chip failures on a wafer attributed to cluster failures which provides information that enables corrective measures to be taken to increase subsequent yields.

It is a further object of this invention to provide such a system and method of identifying the number of chip failures on a wafer attributed to cluster failures which enables the increase of subsequent measured yields by eliminating yield loss due to gross deformation mechanisms.

It is a further object of this invention to provide such a system and method of identifying the number of chip failures on a wafer attributed to cluster failures which reduces the overall cost of purchasing IC chips by increasing chip yield.

This invention results from the realization that the chip yield loss attributed to random failures as opposed to cluster failures can be extracted by using a sampling window to identify failed chips in cluster sites and successively adjusting the measured yield in proportion to the number of failed chips found to be in clusters until the adjusted yield stabilizes at the random failure yield.

This invention features a system of identifying the number of chip failures on a wafer attributed to cluster failures. The system includes means for measuring the absolute yield of the chips on a wafer and means for identifying a first set of clustered failed chips in which each failed chip is disposed in a field of chips whose yield is below the absolute yield. The system includes means for determining an adjusted yield discounted for the first set of clustered failed chips and means for identifying at least one additional set of clustered failed chips in which each failed chip is disposed in a field of chips whose yield is below the adjusted yield. The system also includes means for determining an additional adjusted yield for each additional set of clustered failed chips requiring discounting for the previous set of clustered failed chips until the difference between the last adjusted yield is within a predetermined range of the next to last adjusted yield for indicating the non-clustered failure yield of the wafer.

In a preferred embodiment the means for identifying a first set of clustered failed chips may include means for defining a window of chips of a predetermined sized about each failed chip. The predetermined window size may be five chips by five chips. The means for defining may include means for determining a window yield for each window of chips about each of the failed chips. The means for determining a window yield may include means for counting the number of failed chips in windows having lower yields than the absolute yield. The means for determining the adjusted yield may include means for reducing the total number of chips on the wafer by the number of clustered failed chips in the first set of clustered failed chips identified and for calculating the adjusted yield from the reduced total number of chips. The means for identifying at least one additional set of clustered failed chips may include means for defining a window of chips of a predetermined size about each failed chip. The predetermined size of the window may be five chips by five chips. The means for defining may include means for determining a window yield for each window of chips about each of the failed chips. The means for determining a window yield may include means for counting the number of failed chips in windows having lower yields than the adjusted yield. The means for determining the additional adjusted yield may include means for further reducing the reduced total number of chips on the wafer by the number of clustered failed chips in the at least one additional set of clustered failed chips identified and for calculating the additional yield from the further reduced total number of chips. There may further be included means, responsive to the non-clustered failure yield and the absolute yield, for calculating yield loss attributed to cluster failures. There may further be included means, responsive to the yield loss attributed to cluster failures, for indicating whether the wafer is defective. There may further be included means for displaying the non-clustered failure yield and means for displaying the yield loss attributed to cluster failures.

This invention also includes a method of identifying the number of chip failures on a wafer attributed to cluster failures. The method includes measuring the absolute yield of the chips on a wafer and identifying a first set of clustered failed chips in which each failed chip is disposed in a field of chips whose yield is below the absolute yield. The method includes determining an adjusted yield discounted for the first set of clustered failed chips and identifying at least one additional set of clustered failed chips in which each failed chip is disposed in a field of chips whose yield is below the adjusted yield. The method also includes determining an additional adjusted yield for each additional set of clustered failed chips requiring discounting for the previous set of clustered failed chips until the difference between the last adjusted yield is within a predetermined range of the next to last adjusted yield for indicating the non-clustered failure yield of the wafer.

In a preferred embodiment the step of identifying a first set of clustered failed chips may include defining a window of chips of a predetermined size about each failed chip. The window size may be five chips by five chips. The step of defining may include determining a window yield for each window of chips about each of the failed chips. The step of determining may include means for counting the number of failed chips in windows having lower yields than the absolute yield. The step of determining the adjusted yield may include reducing the total number of chips on the wafer by the number of clustered failed chips in the first set of clustered failed chips identified and calculating the adjusted yield from the reduced total number of chips. The step of identifying at least one additional set of clustered failed chips may include defining a window of chips of a predetermined size about each failed chip. The predetermined size of the window may be five chips by five chips. The step of defining may include means for determining a window yield for each window of chips about each of the failed chips. The step of determining a window yield may include counting the number of failed chips and windows having lower yields than the adjusted yield. The step of determining the additional adjusted yield may include further reducing the reduced total number of chips on the wafer by the number of clustered failed chips in the at least one additional set of clustered failed chips identified and calculating the additional adjusted yield from the further reduced total number of chips. There may further be included the step of calculating yield loss attributed to cluster failures from the non-clustered failure yield and the absolute yield. There may further be included the step of indicating whether the wafer is defective from the yield loss attributed to cluster failures. There may further be included the step of displaying the non-clustered failure yield and the yield loss attributed to cluster failures.

DISCLOSURE OF PREFERRED EMBODIMENT

Other objects, features and advantages will occur to those skilled in the art from the following description of a preferred embodiment and the accompanying drawings, in which.

Figure 1:
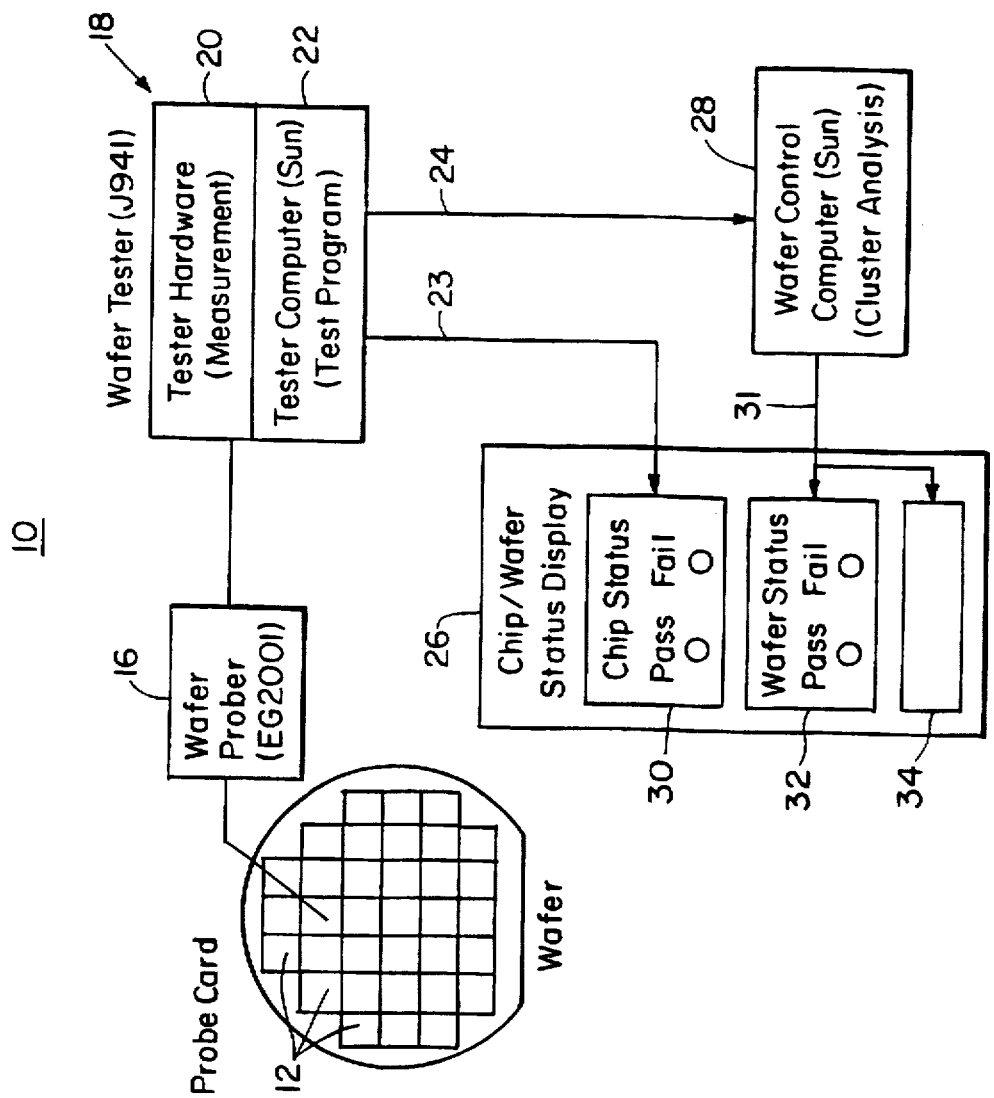
FIG. 1 is a schematic view of the system and method of identifying the number of chip failures on a wafer attributed to cluster failures according to this invention.

There is shown in FIG. 1 a system 10 which is capable of identifying the number of integrated circuit chip 12 failures on wafer 14 which are attributable to gross deformation mechanisms and local deformation mechanisms. System 10 first performs a standard check of each chip 12 on wafer 14 with wafer prober 16, such as an EG2001 prober from Electroglass, Inc., which is driven by wafer tester 18, such as a J941 wafer tester produced by Teradyne, Inc. Wafer tester 18 includes wafer tester measurement hardware 20 which operates under the control of tester computer 22, such as a SUN computer work station, which runs the appropriate test program for the particular tppe of chips under test.

Wafer tester 18 outputs from wafer tester computer 22 over lines 23 and 24 a signal indicating whether each individual chip 12 on wafer 14 either passes (i.e. is a good chip) or fails (i.e. is a defective chip) to chip/wafer status display 26 and wafer control computer 28, respectively. Wafer control computer 28 may also be SUN computer work station or a similar type of computer. Chip/wafer status display 26 provides a visual indication on chip status display 30 whether each individual chip 12 has passed or failed the test performed by wafer tester 18. Wafer control computer 28 accumulates the pass and fail data supplied to it from wafer tester 18 and after every chip 12 on wafer 14 has been tested, wafer control computer 28, based on certain predetermined criteria, provides a signal over line 31 to wafer status display 32 on chip/wafer status display 26 which displays whether wafer 14 being tested has either passed or failed. Wafer control computer 28 also determines, as described below, the total yield which is the ratio of good chips to total number of chips on wafer 14, the "non-zero yield", an indication of the yield attributable to local deformation mechanisms (random failures), and the "zero-yield", an indication of the yield attributable to clustered global deformation mechanisms. This information is displayed on display 34.

Figure 2A:
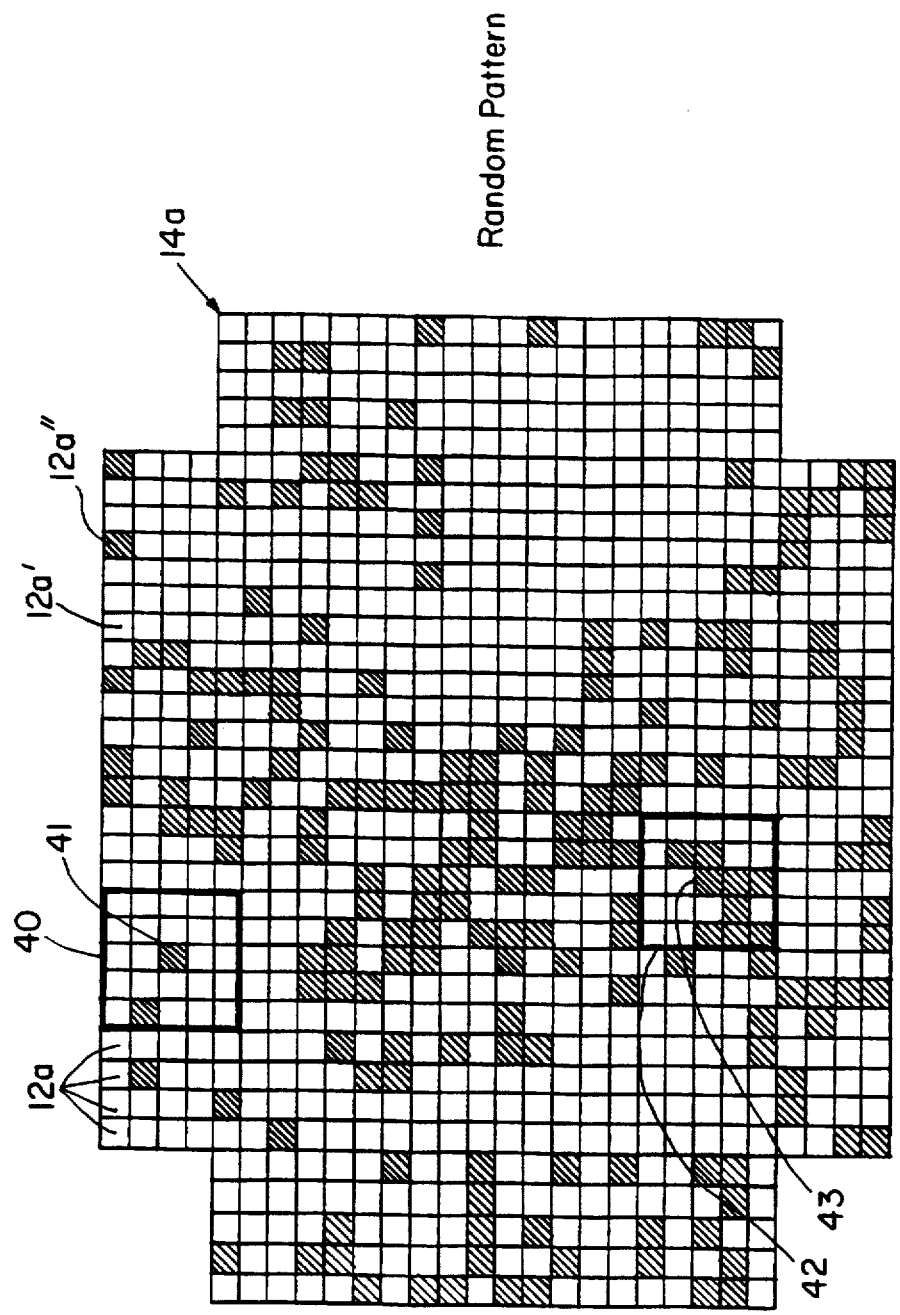
FIG. 2A is a schematic depiction of a wafer including a number of defective chips distributed in a random pattern.

Wafer 14a, FIG. 2A, has a large number of chips 12a. Most of the chips are good chips, designated by the white boxes 12a', but a number of the chips are defective and are designated by the black boxes 12a". The distribution of defective chips 12a" in FIG. 2A is a random distribution which results from local deformation mechanisms, such as, for example, pinholes, pipes, and/or photolithography spot defects. These random defects are expected, accepted, and the number of these types of defects from wafer to wafer is fairly predictable for a given manufacturing process.

Figure 2B:
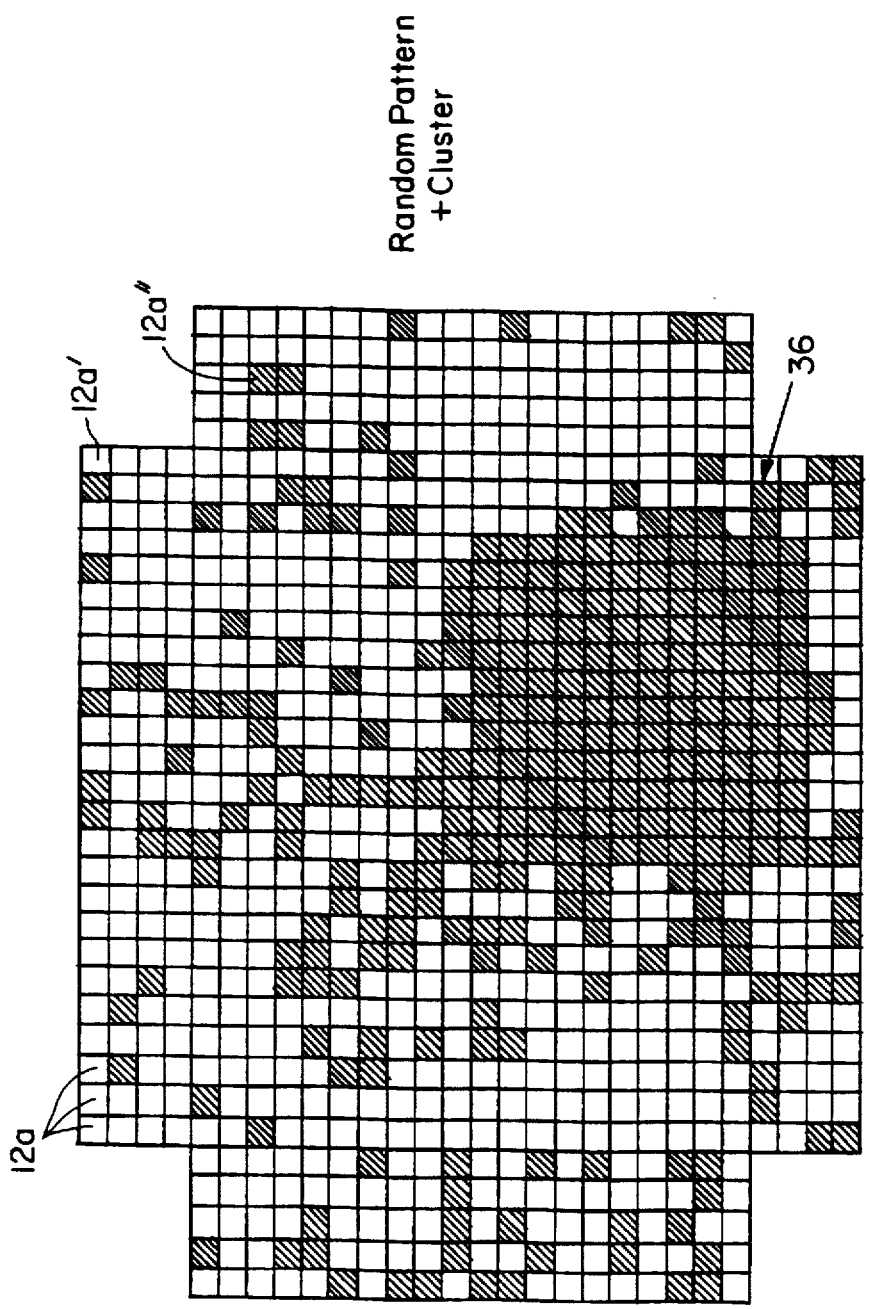
FIG. 2B is the wafer of FIG. 2A with the random distribution of defects and a cluster of defects superimposed thereon.

This same random distribution of defective chips is shown in FIG. 2B but with the addition of a large cluster 36 of failed chips due to a gross deformation mechanism resulting from one or more manufacturing errors, such as mask misalignments, variations in process temperatures and heating durations, and non-uniform impurity concentration across the wafer. These types of defects, as opposed to random defects, can be prevented or at least limited and because of this it is very useful for improving the manufacturing process to be able to distinguish between the yield of good chips on a wafer due to local deformation mechanisms (random defects) and global deformation mechanisms (clustered defects). The prior art methodology provides only an overall yield of good chips to the total number of chips on the wafer and does not distinguish between the two specific types of very different defects.

Figure 3:
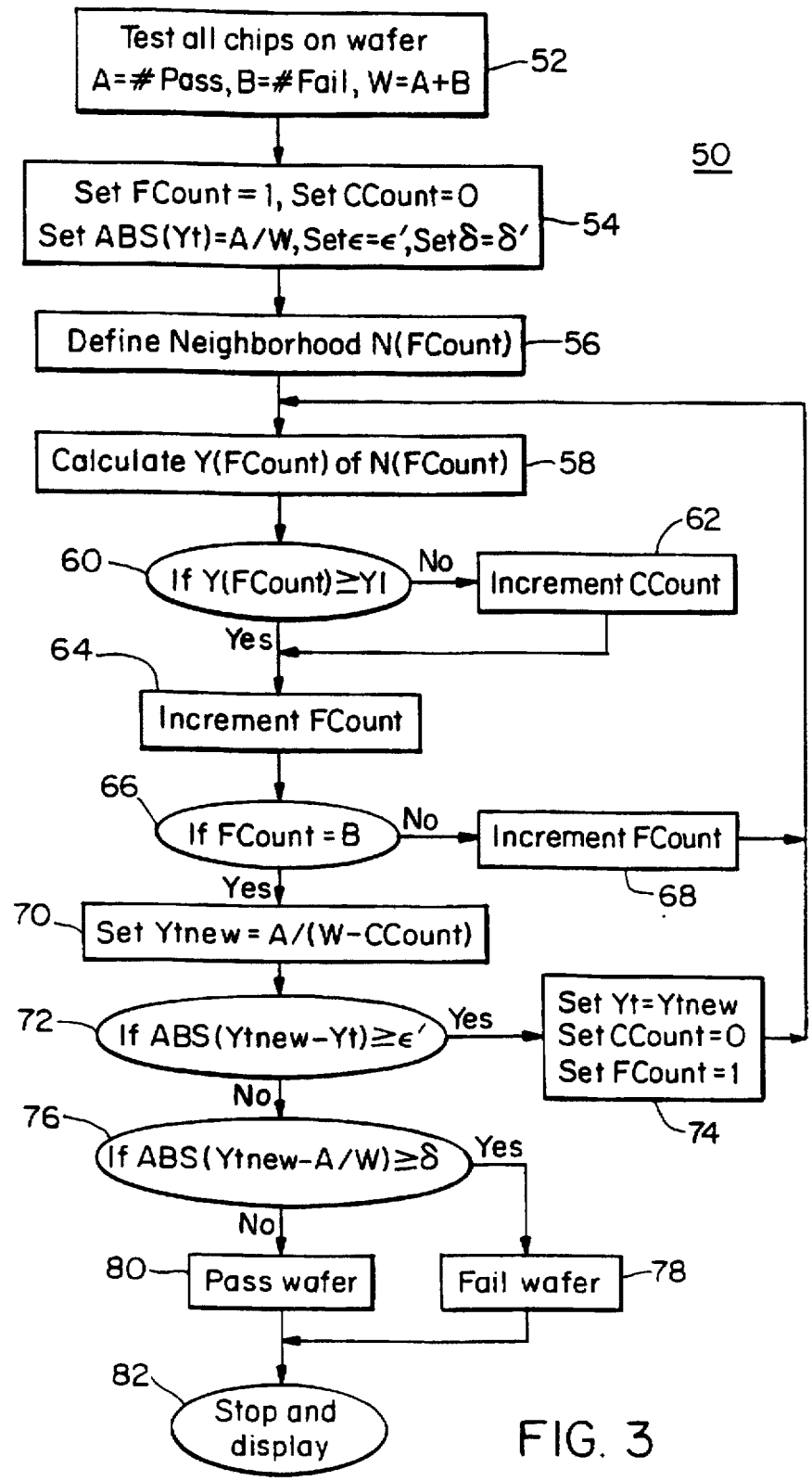
FIG. 3 is a flow chart of the software of the wafer control computer of FIG. 1.

Wafer control computer 28, FIG. 1, operates according to flow chart 50, FIG. 3, to determine wafer yield and to determine if each wafer passes or fails certain predetermined criteria. In step 52 of flow chart 50 wafer control computer 28, FIG. 1, receives the test information from wafer tester 18, including the number of chips which passed (A), the number of chips which failed (B) and the total number of chips on the wafer (A+B). At step 54 the failed chip count (FCount), which is a count of the total number of failed chips, is set to one. The cluster count (CCount), which is equal to the total number of failed chips located within a cluster of failed chips (defined below) is set to zero. The threshold yield, Yt, is set to the absolute yield (i.e. A/W which is the ratio of good chips to the total number of chips on the wafer under test). The maximum difference between the previous yield and the new yield, $\epsilon$, is set to $\epsilon'$, typically 3%.

Finally in step 54 the value of $\delta$ is set to $\delta'$, typically 5%, which is the maximum acceptable percentage of defective chips located in clustered areas; i.e. the maximum acceptable yield loss due to gross deformation mechanism for a passing wafer. In step 56 the neighborhood for each failed chip, N (FCount), is defined. At this step in the process a window, such as window 40, FIGS. 2A and 4, centered around failed chip 41 and window 42 centered around failed chip 43, for example, encompassing an area of five chips by five chips is defined at each failed chip site. It has been determined that utilizing a window encompassing an area of 5 chips by 5 chips produces the most accurate results. At step 58 the neighborhood yield, Y (FCount), which is equal to the ratio of the number of good chips to the total number of chips in the neighborhood around each failed chip, N (FCount), is determined one failed chip at a time.

Figure 4:
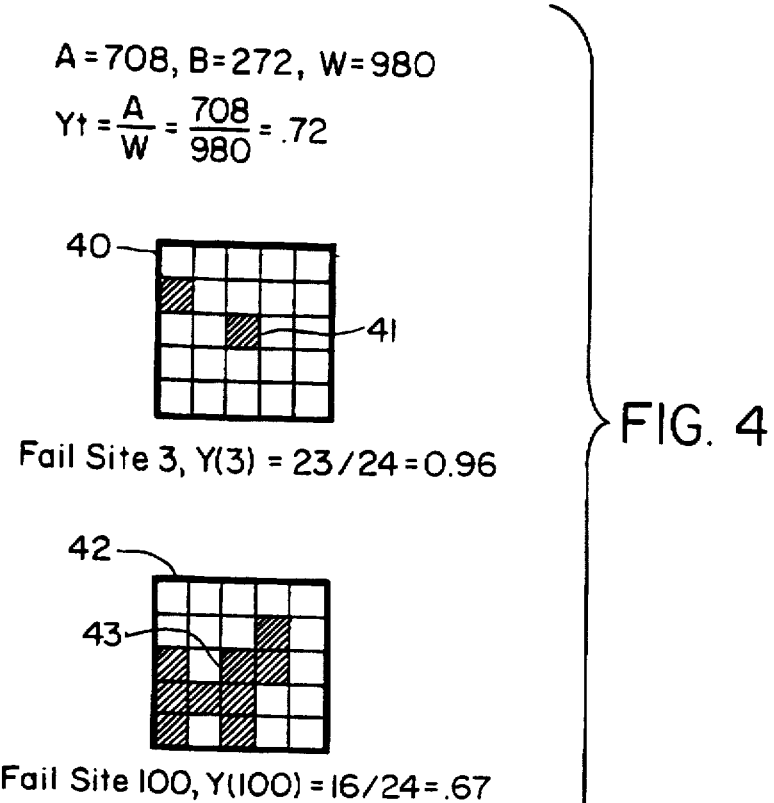
FIG. 4 depicts a close up view of two defective chips on the wafer of FIG. 2A and the defined neighborhoods surrounding these failed chips.

As shown in FIG. 4, neighborhood 40 surrounding failed chip 41 encompasses an area of twenty-four chips excluding failed chip 41. In that area there are twenty-three good chips out of the total number of twenty-four chips which equates to a neighborhood yield, Y (FCount), equal to 0.96. Neighborhood 42 centered around failed chip 43 has only sixteen good chips out of its twenty-four chips surrounding failed chip 43. This equates to a neighborhood yield, Y (FCount), equal to 0.67.

At step 60 the neighborhood yield, Y (FCount), is calculated for the present neighborhood and it is determined if it is equal to or exceeds the threshold yield, Yt. If the neighborhood yield is not greater than or equal to the threshold yield this indicates that the failed chip is located in a cluster area and the cluster count, CCount, is incremented at step 62. Referring to FIG. 4, Neighborhood 42 has a yield of 0.67 which is less than the threshold yield of 0.72 (A=708, B=272, W=980 and Yt=0.72). This would cause the CCount to be incremented. If, however, the neighborhood yield does exceed the threshold yield indicating that the failed chip centered around that particular neighborhood, such as failed chip 41, FIG. 4, in neighborhood 40, is not located in a cluster site the cluster count, CCount, is not incremented.

In either case at step 64 the failed chip count, FCount, is incremented and at step 66 it is determined if the failed chip count is equal to B which is the total number of chip failures. If FCount does not equal B at step 68, indicating that each failed chip has been tested to determine if it is located within a cluster, the failed chip count is incremented and the system loops back to step 58 where the process and the next failed chip is evaluated.

At step 66 if FCount does equal B this indicates that all failed chips have been analyzed and the system proceeds to step 70 where the new threshold yield, Ytnew, is set. This threshold is equal to A/(W−CCount). This process effectively removes from the number of total chips the number of failed chips which are located in a cluster site. At step 72 it is determined if the absolute value of the new threshold yield, Ytnew, minus the threshold yield, Yt, is greater than or equal to $\epsilon'$. As noted above, $\epsilon'$ is equal to the maximum acceptable difference between the previous yield and the new yield. If the difference is less than or equal to $\epsilon'$ this indicates that the yields are sufficiently equal to indicate that the present yield is equal to the yield attributed only to local deformation defects with the yield loss attributed to gross deformation defects removed from the yield calculation. If it is not, then at step 74 the new threshold, Ytnew, is designated as the threshold yield, Yt, the cluster count, CCount, is reset to zero, the failed chip count, FCount, is reset to one and the system loops back to step 58. Each failed chip and the neighborhood surrounding each chip as previously defined in step 56, are again visited.

If at step 72 the absolute value of the new threshold, Ytnew, minus Yt is less than or equal to $\epsilon'$ the system proceeds to step 76 where it is determined if the absolute value of the new threshold, Ytnew, minus the original threshold (A/W) is greater than or equal to $\delta'$, the maximum acceptable yield loss due to gross deformation mechanisms. If it does exceed $\delta'$, at step 78 a wafer fail signal is generated. If it does not exceed $\delta'$ a wafer pass signal is generated at step 80. At step 82 the wafer testing is terminated and the overall yield, the yield due only to local deformation defects, and the yield loss due to global deformation defects are displayed.

This process may be best understood by way of an example using the absolute yield of 0.72, Yt=A/W=708/980=0.72 as shown in FIG. 4. After each of the 272 failed chips are initially checked it is determined that the neighborhood yields of 100 failed chips are below the absolute yield of 0.72. According to the flow chart 50, FIG. 3, a new yield, Ytnew, is calculated at step 70 as follows:

$$Ytnew=708/(980-100)=708/880=0.80. \qquad (1)$$

At step 72 it is determined that the absolute value of the new yield, Ytnew, minus the absolute yield, Yt, is greater than or equal to ε' which in this example is equal to 0.01. Since the new yield, Ytnew, of 0.8 minus the absolute yield, Yt, of 0.72 is greater than 0.01, the loop of steps 58–72 of flow chart 50, FIG. 3, are again carried out with Yt now set at 0.8. With Yt now equal to 0.8 it is determined that there are 50 failed chips which have neighborhoods with a neighborhood yield of less than 0.8. Thus, the new yield, Ytnew, is calculated at step 70 as follows:

$$Ytnew=708/(880-50)=0.85 \qquad (2)$$

The absolute value of the new threshold yield, Ytnew, of 0.85 minus the previous yield, Yt, of 0.8 is determined to be 0.05. Since the absolute value is still not less than or equal to ε', the system again loops back through steps 58–72 with the yield, Yt, now set at 0.85. With this new yield it is determined that there are only 10 failed chips in areas with neighborhood yields less than the yield of 0.85. The new yield, Ytnew, is again calculated at step 70 to as follows:

$$Ytnew=708/(830-10)=0.86 \qquad (3)$$

Since the absolute value of the new yield, Ytnew, minus the yield, Yt, equals 0.01 (ε'=0.01) this indicates that the yield 0.86 is the yield attributed only to local deformation mechanisms. By subtracting this yield from the original overall yield of 0.72 it is determined that the yield loss attributed to global deformation mechanisms is equal to 0.14. Since, δ is equal to 0.10, the wafer in this example would be rejected since its yield loss of 0.14 exceeds the acceptable yield loss of 0.10.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A system of identifying the non-clustered failure yield on a wafer, comprising:

means for measuring an absolute yield of the chips on a wafer;

means for identifying a first set of clustered failed chips in which each failed chip is disposed in a field of chips whose yield is below the absolute yield;

means for determining an adjusted yield discounted for said first set of clustered failed chips;

means for identifying at least one additional set of clustered failed chips in which each failed chip is disposed in a field of chips whose yield is below said adjusted yield; and means for determining an additional adjusted yield for each additional set of clustered failed chips discounting for said previous set of clustered failed chips until the difference between the additional adjusted yield and the previous adjusted yield is within a predetermined maximum acceptable difference for indicating a non-clustered failure yield of the wafer.

2. The system of claim 1 in which said means for identifying a first set of clustered failed chips includes means for defining a window of chips of a predetermined size about each said failed chip.

3. The system of claim 2 in which said predetermined window size is five chips by five chips.

4. The system of claim 2 in which said means for defining includes means for determining a window yield for each window of chips about each of said failed chips.

5. The system of claim 4 in which said means for determining a window yield includes means for counting the number of failed chips in windows having lower yields than said absolute yield.

6. The system of claim 1 in which said means for determining said adjusted yield includes means for reducing the total number of chips on the wafer by the number of clustered failed chips in the first set of clustered failed chips identified and for calculating said adjusted yield from said reduced total number of chips.

7. The system of claim 6 in which said means for determining said additional adjusted yield includes means for further reducing said reduced total number of chips on the wafer by the number of clustered failed chips in said at least one additional set of clustered failed chips identified and for calculating said additional adjusted yield from said further reduced total number of chips.

8. The system of claim 1 in which said means for identifying at least one additional set of clustered failed chips includes means for defining a window of chips of a predetermined size about each said failed chip.

9. The system of claim 8 in which said predetermined window size is five chips by five chips.

10. The system of claim 8 in which said means for defining includes means for determining a window yield for each window of chips about each of said failed chips.

11. The system of claim 10 in which said means for determining a window yield includes means for counting the number of failed chips in windows having lower yields than said adjusted yield.

12. The system of claim 1 further including means, responsive to said non-clustered failure yield and said absolute yield, for calculating yield loss attributed to cluster failures.

13. The system of claim 12 further including means, responsive to said yield loss attributed to cluster failures, for indicating whether the wafer is defective.

14. The system of claim 12 further including means for displaying said yield loss attributed to cluster failures.

15. The system of claim 1 further including means for displaying the non-clustered failure yield.

16. A method of identifying the non-clustered failure yield on a wafer, comprising:

measuring an absolute yield of the chips on a wafer;

identifying a first set of clustered failed chips in which each failed chip is disposed in a field of chips whose yield is below the absolute yield;

determining an adjusted yield discounted for said first set of clustered failed chips;

identifying at least one additional set of clustered failed chips in which each failed chip is disposed in a field of chips whose yield is below said adjusted yield; and determining an additional adjusted yield for each additional set of clustered failed chips discounting for said previous set of clustered failed chips until the difference between the additional adjusted yield and the previous adjusted yield is within a predetermined maximum acceptable difference for indicating a non-clustered failure yield of the wafer.

17. The method of claim 16 in which the step of identifying a first set of clustered failed chips includes defining a window of chips of a predetermined size about each said failed chip.

18. The method of claim 17 in which said predetermined window size is five chips by five chips.

19. The method of claim 17 in which the step of defining includes determining a window yield for each window of chips about each of said failed chips.

20. The method of claim 19 in which the step of determining a window yield includes counting the number of failed chips in windows having lower yields than said absolute yield.

21. The method of claim 16 in which the step of determining the adjusted yield includes reducing the total number of chips on the wafer by the number of clustered failed chips in the first set of clustered failed chips identified and calculating said adjusted yield from said reduced total number of chips.

22. The method of claim 21 in which the step of determining said additional adjusted yield includes further reducing said reduced total number of chips on the wafer by the number of clustered failed chips in said at least one additional set of clustered failed chips identified and calculating said additional adjusted yield from further said reduced total number of chips.

23. The method of claim 16 in which the step of identifying at least one additional set of clustered failed chips includes defining a window of chips of a predetermined size about each said failed chip.

24. The method of claim 23 in which said predetermined window size is five chips by five chips.

25. The method of claim 23 in which the step of defining includes determining a window yield for each window of chips about each of said failed chips.

26. The method of claim 25 in which the step of determining a window yield includes counting the number of failed chips in windows having lower yields than said adjusted yields.

27. The method of claim 16 further including calculating yield loss attributed to cluster failures from said non-clustered failure yield and said absolute yield.

28. The method of claim 27 further including indicating whether the wafer is defective from the yield loss attributed to cluster failures.

29. The method of claim 27 further including displaying said yield loss attributed to cluster failures.

30. The method of claim 16 further including displaying the non-clustered failure yield.

* * * * *